(12) United States Patent
Nakatani

(10) Patent No.: US 7,380,320 B2
(45) Date of Patent: Jun. 3, 2008

(54) PIEZOELECTRIC DEVICE AND METHOD OF MANUFACTURING THE DEVICE

(75) Inventor: Masaya Nakatani, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 44 days.

(21) Appl. No.: 11/566,379

(22) Filed: Dec. 4, 2006

(65) Prior Publication Data

US 2007/0090085 A1 Apr. 26, 2007

Related U.S. Application Data

(62) Division of application No. 10/399,739, filed on Sep. 18, 2003, now Pat. No. 7,176,604.

(51) Int. Cl.
*H01L 41/22* (2006.01)
*H01L 41/00* (2006.01)
*G03C 5/00* (2006.01)
*C23F 1/00* (2006.01)
*C03C 15/00* (2006.01)
*B44C 1/22* (2006.01)

(52) U.S. Cl. .............. 29/25.35; 310/370; 310/363; 430/312; 430/316; 216/2; 216/41; 216/72

(58) Field of Classification Search ............... 29/25.35, 29/825, 846, 847; 310/363, 370; 430/312, 430/316; 216/2, 41, 49, 56, 67, 72, 75, 76, 216/79

See application file for complete search history.

(56) References Cited

U.S. PATENT DOCUMENTS

| | | | |
|---|---|---|---|
| 5,438,231 A | | 8/1995 | Khoshnevisan et al. |
| 5,873,154 A | * | 2/1999 | Ylilammi et al. .......... 29/25.35 |
| 5,910,756 A | * | 6/1999 | Ella ........................ 333/133 |
| 6,010,919 A | | 1/2000 | Matsuhiro et al. |
| 6,021,552 A | * | 2/2000 | Kishima et al. .......... 29/25.35 |
| 6,307,447 B1 | * | 10/2001 | Barber et al. ............ 333/189 |
| 6,339,276 B1 | * | 1/2002 | Barber et al. ............ 310/312 |
| 6,407,649 B1 | * | 6/2002 | Tikka et al. ............. 333/133 |
| 6,476,536 B1 | * | 11/2002 | Pensala .................. 310/312 |
| 6,787,048 B2 | * | 9/2004 | Bradley et al. ........... 216/13 |
| 6,842,088 B2 | * | 1/2005 | Yamada et al. .......... 333/187 |

(Continued)

FOREIGN PATENT DOCUMENTS

GB 2029092 A 3/1980

(Continued)

OTHER PUBLICATIONS

Japanese International Search Report for PCT/JP02/08056, dated Nov. 19, 2002.

*Primary Examiner*—Victor Batson
*Assistant Examiner*—David P Angwin
(74) *Attorney, Agent, or Firm*—RatnerPrestia

(57) ABSTRACT

A piezoelectric device includes a substrate, a buffer layer on the substrate, a lower electrode layer on the buffer layer, a piezoelectric layer on the lower electrode layer, and an upper electrode layer on the piezoelectric layer. The piezoelectric layer has a base portion extending outwardly at its lower portion of its periphery. The piezoelectric device provides enhanced bonding strength between the substrate and the stacked structure including the upper electrode layer, the lower electrode layer, and the piezoelectric layer.

12 Claims, 9 Drawing Sheets

U.S. PATENT DOCUMENTS

| | | |
|---|---|---|
| 6,909,340 B2 * | 6/2005 | Aigner et al. ............... 333/189 |
| 6,911,708 B2 * | 6/2005 | Park ........................... 257/416 |
| 2003/0066350 A1 | 4/2003 | Machida et al. |
| 2003/0132991 A1 | 7/2003 | Higuchi et al. |
| 2004/0132310 A1 | 7/2004 | Nakatani et al. |
| 2005/0000934 A1 | 1/2005 | Nakatani et al. |
| 2005/0099100 A1 | 5/2005 | Kita et al. |

FOREIGN PATENT DOCUMENTS

| | | | |
|---|---|---|---|
| JP | 06-347471 | | 12/1994 |
| JP | EP 0 675 355 | | 10/1995 |
| JP | 10-173476 | | 6/1998 |
| JP | 2834355 | | 10/1998 |
| JP | 2001-150825 | | 11/1998 |
| JP | 2000-252544 | | 9/2000 |
| JP | 2001-88301 | | 4/2001 |
| JP | 2001-223404 | | 8/2001 |
| JP | 2001237669 A | * | 8/2001 |
| JP | 2001285015 A | * | 10/2001 |
| JP | 2001285016 A | * | 10/2001 |
| JP | 2002009579 A | * | 1/2002 |

* cited by examiner

PIEZOELECTRIC DEVICE AND METHOD OF MANUFACTURING THE DEVICE

This application Is A Divisional application Of U.S. patent application Ser. No. 10/399,739, which Is A U.S. National Phase Application of PCT International Application PCT/JP02/08056 filed on Aug. 7, 2002. The entire disclosure of U.S. patent application Ser. No. 10/399,739 filed on Sep. 18, 2003 now U.S. Pat. No. 7,176,604 is expressly incorporated by reference herein.

TECHNICAL FIELD

The present invention relates to piezoelectric devices, such as a sensor, an actuator, memory, and an optical switch, and to a method of manufacturing the device.

BACKGROUND ART

A conventional piezoelectric device includes a substrate, a lower electrode layer on a surface of the substrate, a piezoelectric layer, and an upper electrode layer which are stacked in this order. When a voltage is applied to the upper electrode layer, the piezoelectric layer deforms due to an electric field developed between the upper and lower layers, thereby providing the device with a variety of functions.

In the conventional piezoelectric device, however, a stacked structure including the upper and lower electrode layers and the piezoelectric layer has poor strength in bonding with the substrate. Applying the voltage to the upper and lower layers deforms the piezoelectric layer, and this causes stress to the substrate. In the conventional piezoelectric device, the upper and lower electrode layers and the piezoelectric layer, being sized substantially the same, are bonded with the substrate. The poor bonding between the lower electrode layer and the substrate causes them to be peeled off.

DISCLOSURE OF THE INVENTION

A piezoelectric device includes a substrate, a lower electrode layer over the substrate, a piezoelectric layer disposed on the lower electrode layer and having a base portion outwardly extending at a portion toward the lower electrode layer, an upper electrode layer on the piezoelectric layer. The base portion is formed at a lower portion of a peripheral face of the piezoelectric layer and extends outwardly from the peripheral face. The piezoelectric layer and the lower electrode layer have areas larger than an area of the upper electrode layer, enhancing strength in bonding. The extending base portion lengthens a creeping distance between the upper and lower electrode layers, thus protecting the electrode layers from being short circuited between the electrode layers.

DESCRIPTION OF THE PREFERRED EMBODIMENT

Figure 1:
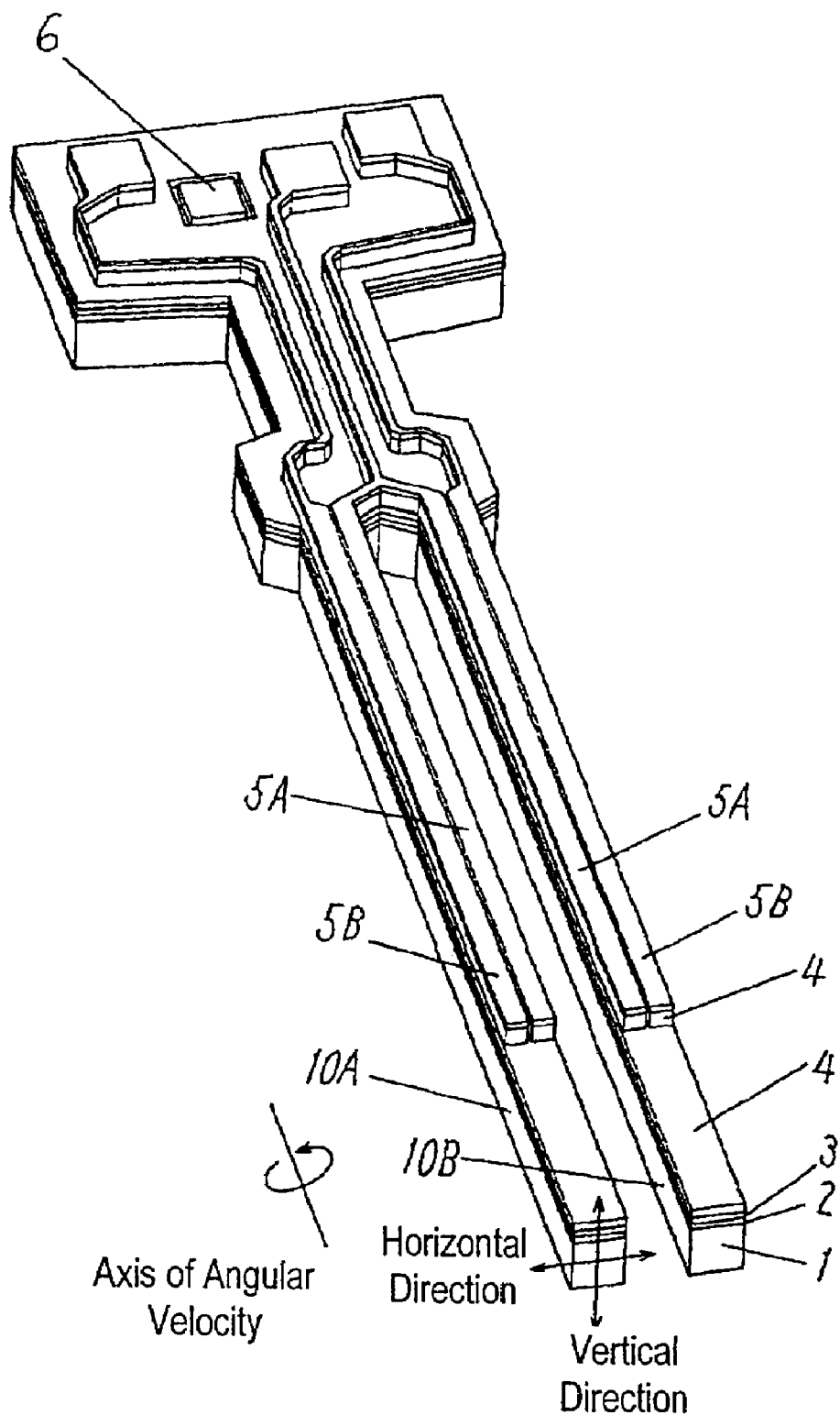
FIG. 1 is a perspective view of an angular velocity sensor according to an exemplary embodiment of the present invention.

FIG. 1 shows an angular velocity sensor as a piezoelectric device of an exemplary embodiment of the present invention. As shown in an exploded perspective view of FIG. 2, the angular velocity sensor includes a tuning-fork-shaped substrate 1 made of silicon, and further includes a buffer layer 2; a lower electrode layer 3; a piezoelectric layer 4; and an upper electrode layer 5, which are stacked on the substrate in this order.

An operation of the angular velocity sensor for detecting an angular velocity will be described with reference to FIG. 1. The upper electrode layer 5 includes an exciting electrode 5A and a detecting electrode 5B, which are disposed opposite to the lower electrode layer 3 as to sandwich the piezoelectric layer 4 with the layer 3. A voltage applied to an area between the exciting electrode 5A and the lower electrode layer 3 expands and contracts the piezoelectric layer 4 sandwiched between the layers 5A and 3, thereby deforming two arms 10A and 10B of the tuning-fork-shaped substrate 1. The arms 10A and 10B vibrate laterally against the tuning-fork shape. When an angular velocity having its axis parallel to the arms 10A and 10B is applied, the arms have a warp in the direction perpendicular to the axis of the angular velocity and a vibrating direction of the arms. The amount of the warp is detected by the detecting electrode 5B. In the angular velocity sensor, excitation for the arms 10A and 10B and the amount of the angular velocity are detected through the piezoelectric layer 4.

Figure 2:
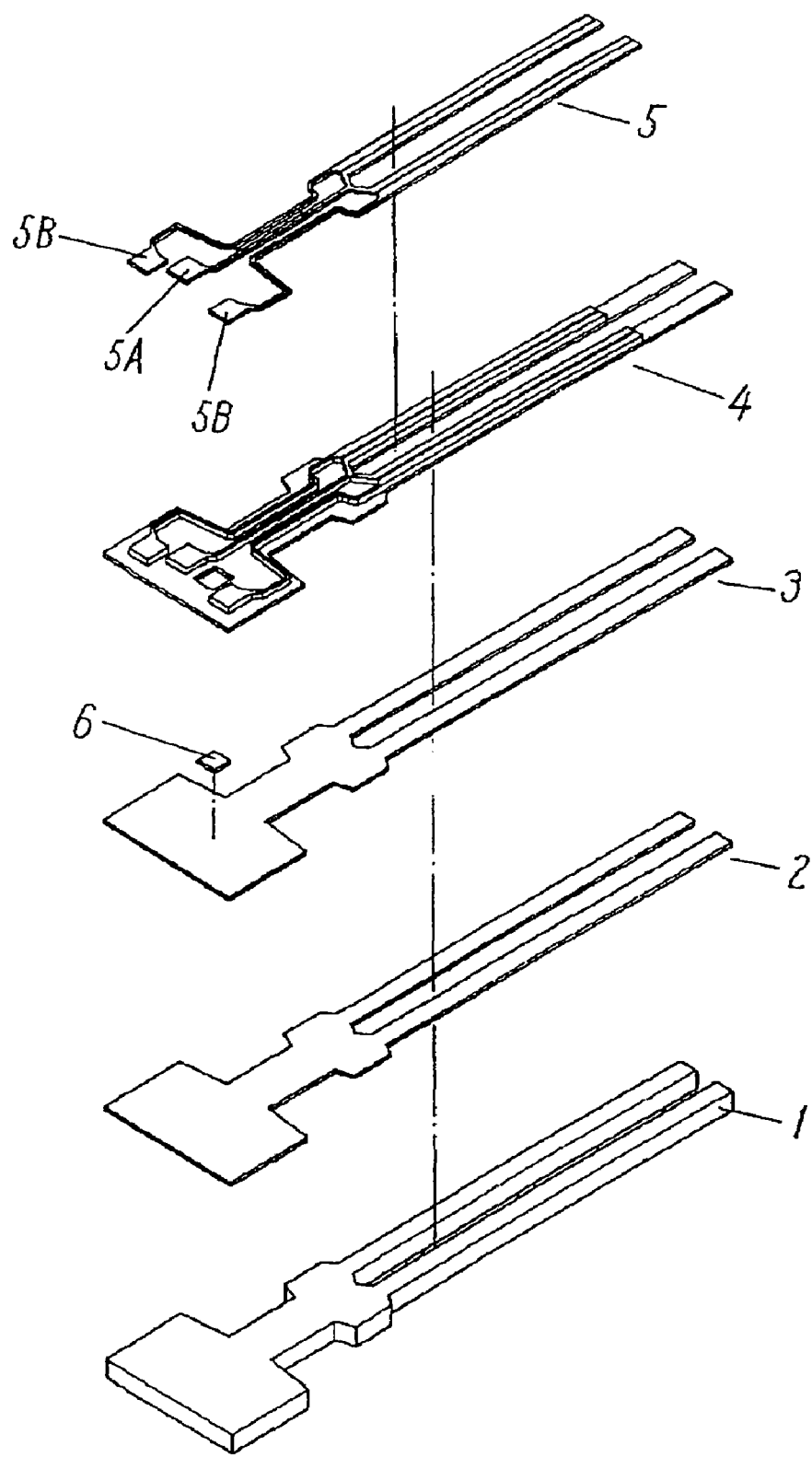
FIG. 2 is an exploded perspective view of the angular velocity sensor according to the embodiment.

The angular velocity sensor will be described in detail with reference to FIG. 2. The angular velocity sensor includes the tuning-fork-shaped substrate 1 made of silicon, the buffer layer 2 on the substrate, and the lower electrode layer 3 on the layer 2. Each of the layers 2 and 3 has a shape substantially identical to that of the substrate 1. The sensor further includes the piezoelectric layer 4 on the lower electrode layer 3 and the upper electrode layer 5 on the piezoelectric layer 4. The piezoelectric layer 4 has its upper portion having a shape identical to that of the upper electrode layer 5 and its lower portion having a shape identical to that of the lower electrode layer 3, as shown in FIG. 2. The lower portion of the piezoelectric layer 4 has a larger area outwardly extending as a base portion (which will be described later). The lower electrode layer 3 beneath the piezoelectric layer 4 has a substantial area since having the same shape as the layer 4 having the base portion, thus being bonded on the substrate 1 the buffer layer 2 securely. Therefore, even if the piezoelectric layer 4 expands and contracts by applying the voltage between the upper layer 5 and the lower layer 3, its stacked structure is hardly peeled off from the substrate 1. Furthermore, the extended base portion lengthens a creeping distance between the upper layer 5 and the lower electrode layer 3, thus protecting the electrode layers from being short circuited between the layers The buffer layer 2 of the angular velocity sensor is made of one of NiO, CoO, MgO, and Ti. The lower electrode layer 3 is made of Pt. The piezoelectric layer 4 is made of lead titanate zirconate. The upper electrode layer is made of Au. The piezoelectric layer 4 is thicker than the buffer layer 2, the lower electrode layer 3, and the upper electrode layer 5. The thickness allows the piezoelectric layer 4 to have the outwardly extending base portion formed easily. The base portion lengthens the creeping distance between the upper and lower layers 5 and 3, thus protecting the electrode layers 5 and 3 from short-circuit between the electrode layers.

An auxiliary electrode 6 shown in FIGS. 1 and 2 is formed to lead the lower electrode layer 3 to a surface.

Figure 3:
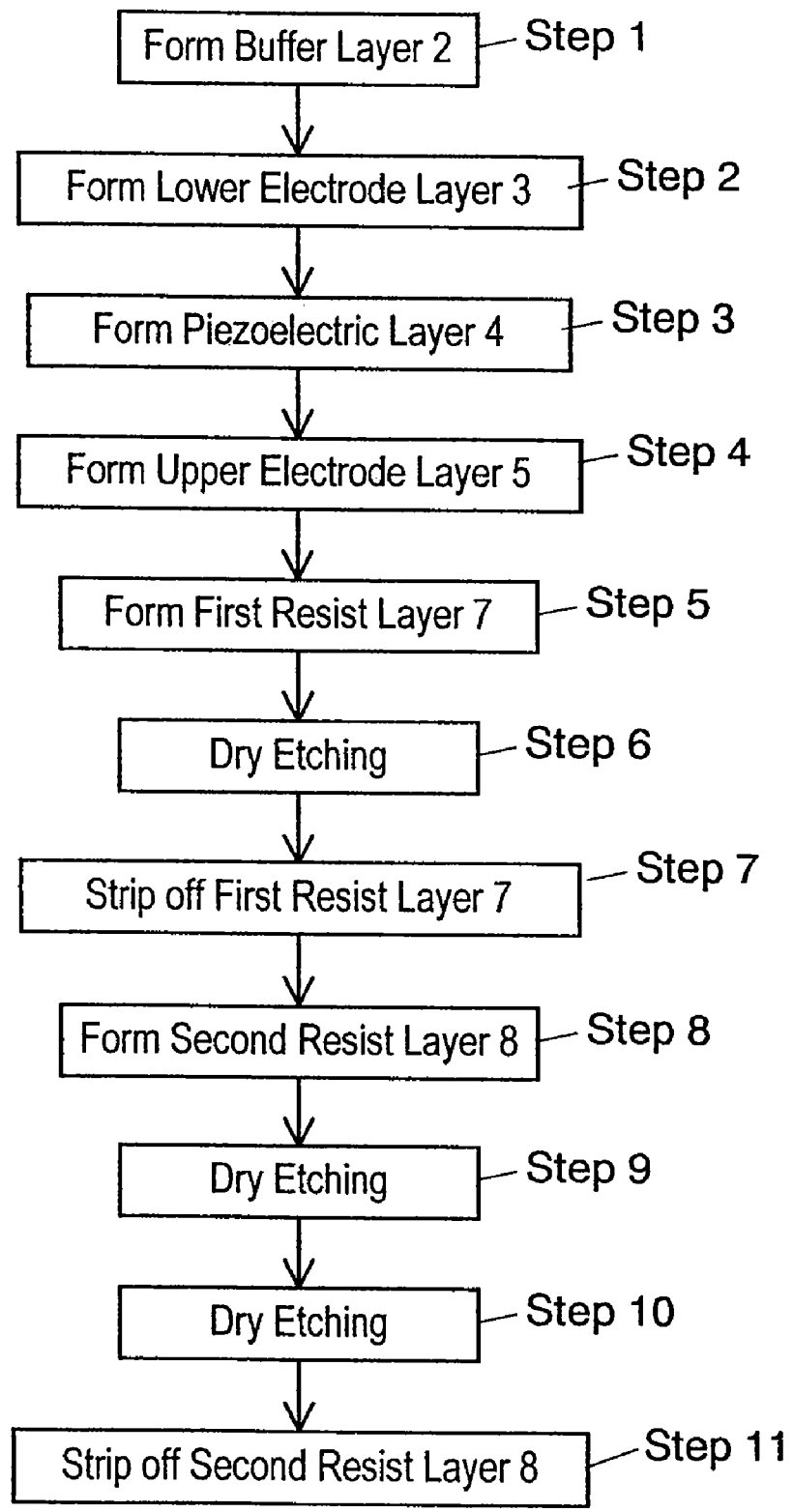
FIG. 3 is a flow chart of a process for manufacturing the angular velocity sensor according to the embodiment.

A method of manufacturing the angular velocity sensor will be described with reference to accompanying drawings. Although plural angular velocity sensors are simultaneously formed on a substrate in a manufacturing process, an explanation is given to one of them. FIG. 3 illustrates the process of manufacturing the angular velocity sensor according to the embodiment. A procedure of the manufacturing will be explained with reference to FIGS. 4 through 15.

Figure 4:
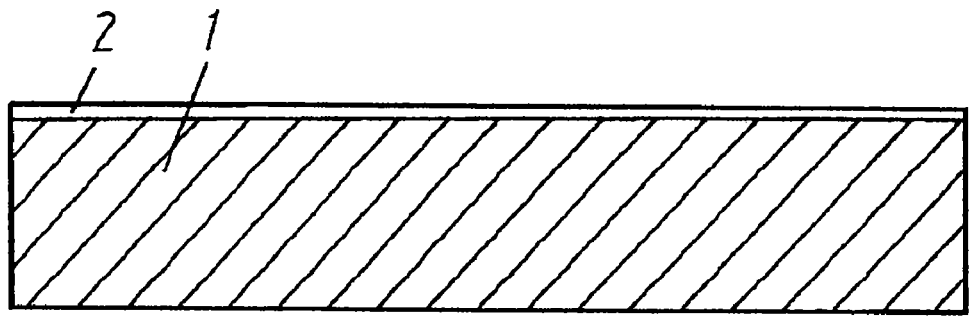
FIG. 4 is a sectional view of the angular velocity sensor for showing the process according to the embodiment.
Figure 5:
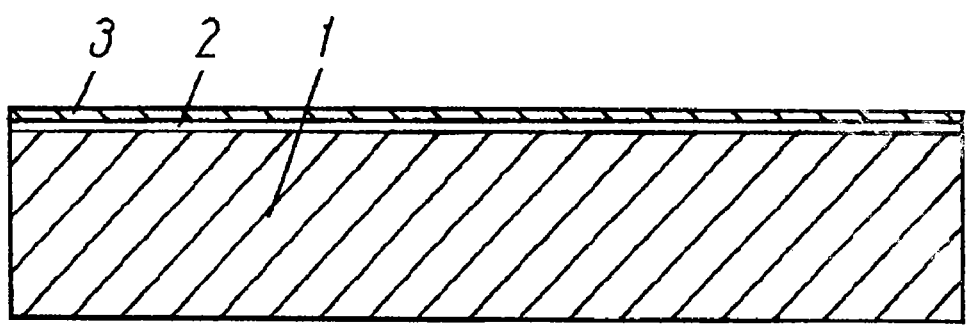
FIG. 5 is a sectional view of the angular velocity sensor for showing the process according to the embodiment.
Figure 6:
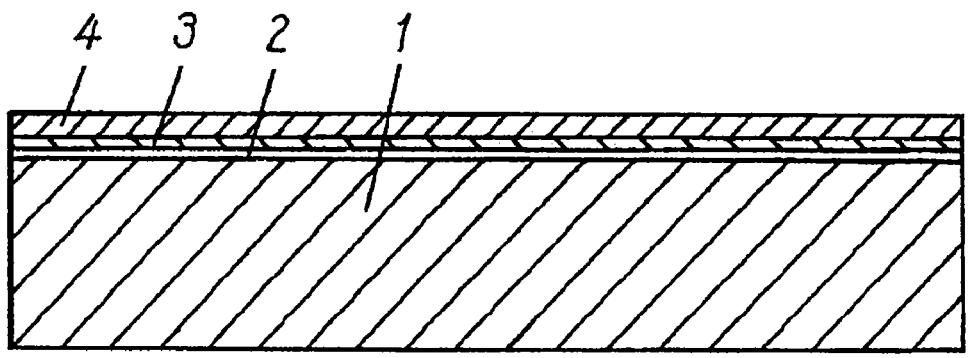
FIG. 6 is a sectional view of the angular velocity sensor for showing the process according to the embodiment.
Figure 7:
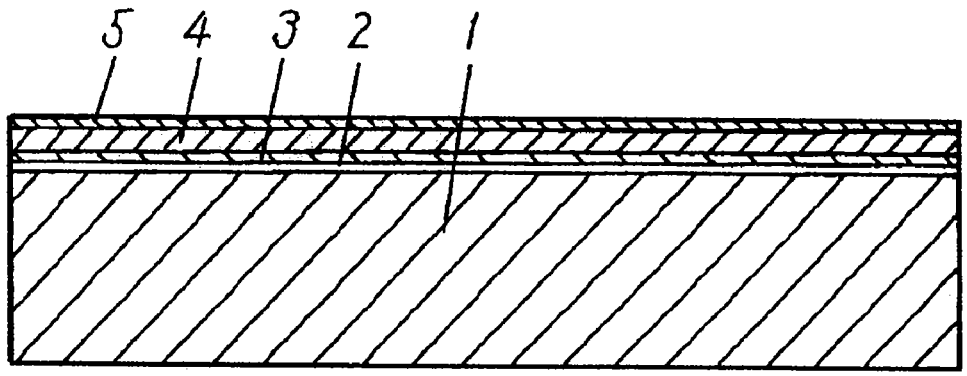
FIG. 7 is a sectional view of the angular velocity sensor for showing the process according to the embodiment.

First, the buffer layer 2 of NiO is formed on a surface of a silicon-made substrate 1, as shown in FIG. 4, so that NiO has a crystal orientation of (1, 0, 0) (STEP 1 of FIG. 3). The buffer layer 2 is formed by metal organic chemical vapor deposition (MOCVD) employing gas, such as sublimated and vaporized nickel acetylacetonate. Next, the lower electrode layer 3 is formed by sputtering Pt, as shown in FIG. 5 (STEP 2 of FIG. 3). Then, as shown in FIG. 6, the piezoelectric layer 4 is formed by sputtering lead titanate zirconate (STEP 3 of FIG. 3). Then, in FIG. 7, the upper electrode layer 5 is formed by sputtering or vacuum evaporation of Au (STEP 4 of FIG. 3).

For forming the gold (Au) layer is formed, thin chromium (Cr)-layer or titanium (Ti)-layer preferably formed on the substrate before the Au-layer is provided. The layers allow the Au-layer to have higher strength in bonding. According to an experiment by the inventor, the Ti-layer having a thickness ranging from about 20 to 100 Å on the substrate by vacuum evaporation provides sufficient adhesion. In conventional piezoelectric devices, it has been difficult to form a piezoelectric layer 4 exhibiting high piezoelectric characteristics on a silicon-made substrate 1. However, the buffer layer 2 described above allows the piezoelectric layer 4 to be made of lead titanate zirconate, thereby providing excellent piezoelectric characteristics.

FIGS. 8 through 15 shows sectional views of the arms 10A and 10B of tuning-fork-shaped portion in FIG. 1. Throughout the drawings, the left side of a drawing corresponds to the arm 10A of FIG. 1, while the right side corresponds to the arm 10B of FIG. 1.

Figure 8:
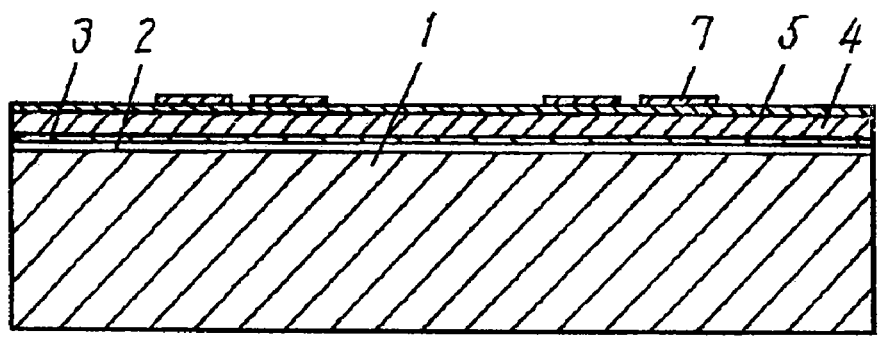
FIG. 8 is a sectional view of the angular velocity sensor for showing the process according to the embodiment.
Figure 9:
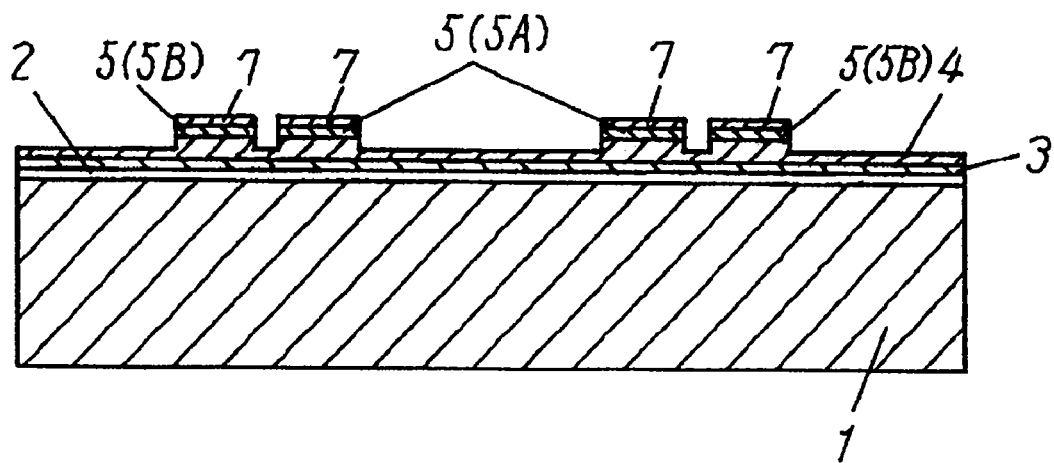
FIG. 9 is a sectional view of the angular velocity sensor for showing the process according to the embodiment.
Figure 10:
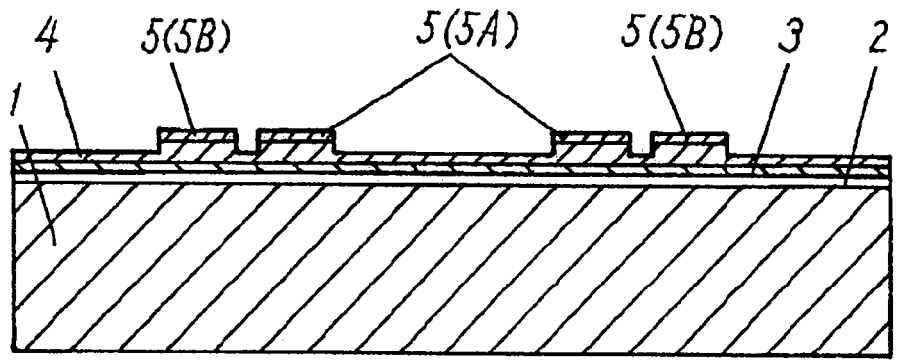
FIG. 10 is a sectional view of the angular velocity sensor for showing the process according to the embodiment.
Figure 11:
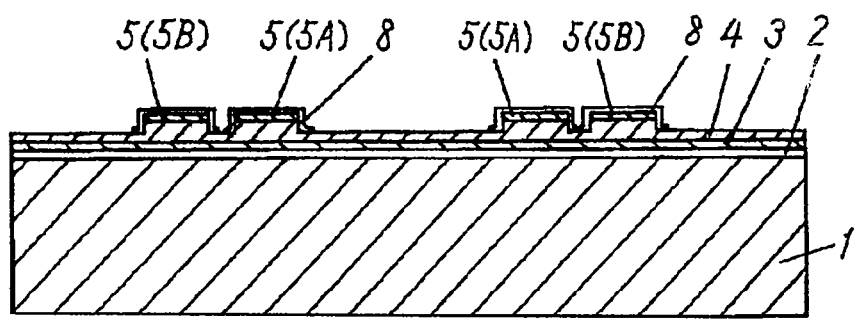
FIG. 11 is a sectional view of the angular velocity sensor for showing the process according to the embodiment.
Figure 12:
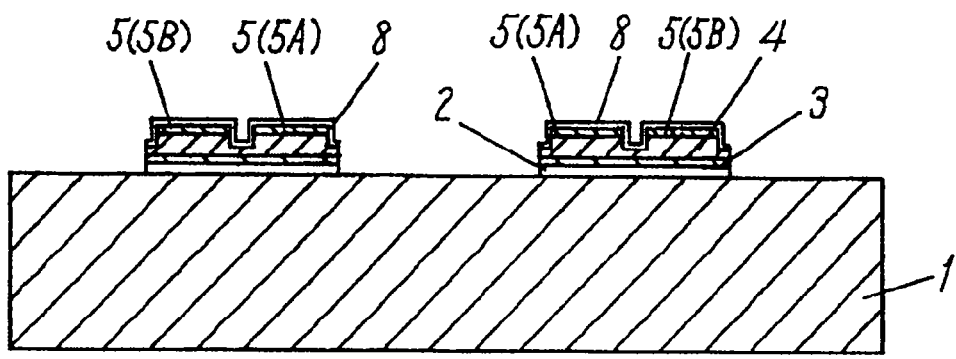
FIG. 12 is a sectional view of the angular velocity sensor for showing the process according to the embodiment.
Figure 13:
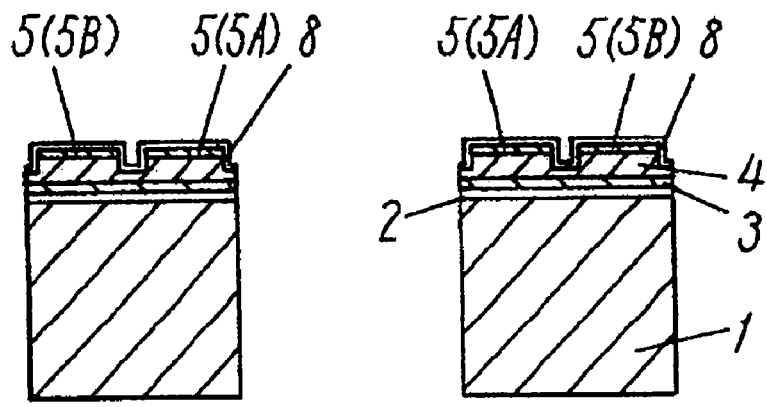
FIG. 13 is a sectional view of the angular velocity sensor for showing the process according to the embodiment.

Following to STEP 4 of FIG. 3, as shown in FIG. 8, a first resist film 7 is formed on the upper electrode layer 5 (STEP 5 of FIG. 3). Then, in FIG. 9, the electrode layer 5 and the piezoelectric layer 4 are etched by dry etching (STEP 6 of FIG. 3). In this process, the etching is stopped in the piezoelectric layer 4 before the etching is performed to the lower electrode layer 3. Next, as shown in FIG. 10, the first resist film 7 is peeled off from the upper electrode layer 5 (STEP 7 of FIG. 3), and thereby, the upper electrode layer 5 is separated into the exciting electrode 5A and the detecting electrode 5B. Then, as shown in FIG. 11, a second resist film 8 is formed on the upper electrode layer 5. A periphery of the film 8 covers the etched edge of the upper electrode layer 5 and an etched side face a small portion of the etched surface of the piezoelectric layer 4 (STEP 8 of FIG. 3). Next, as shown in FIG. 12, the piezoelectric layer 4, the lower electrode layer 3, and the buffer layer 2 are etched away so that the substrate 1 is exposed (STEP 9 of FIG. 3).

Figure 14:
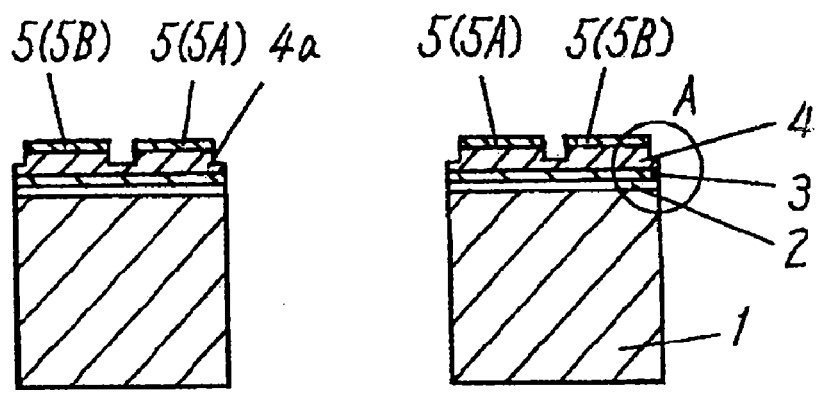
FIG. 14 is a sectional view of the angular velocity sensor for showing the process according to the embodiment.

The process above allows the piezoelectric layer 4 to have the base portion 4a extending outwardly at its lower portion of the periphery, as shown in section A of FIG. 14. The piezoelectric layer 4 having the base portion securely contacts the lower electrode layer 3 through a sufficient area. According to an experiment by the inventor, the piezoelectric layer 4 having no base portion was easily stripped off, while the layer 4 having the base portion was hardly stripped off.

Following STEP 9, the silicon-made substrate 1 is etched by dry etching (STEP 10 of FIG. 3). In the etching process above, the substrate 1 is etched by etching gas different from that used for the piezoelectric layer 4, the lower electrode layer 3, and buffer layer 2 in FIG. 12. The same gas undesirably etches the layers 2, 3, and 4 due to intrusion of the gas from their sides. For example, gas containing $CF_4$ and Ar is used for the layers 2, 3, and 4, and gas containing $SF_6$, $O_2$, and $C_4F_8$ is used for the substrate 1. This enables the substrate 1 to be etched in the vertical downward direction in FIG. 13 with no harm to the base portion 4a of the piezoelectric layer 4, after the layers 2, 3, and 4 are etched away.

In the final process shown in FIG. 14, the second resist film 8 is removed by oxygen-ashing or other methods (STEP 11 of FIG. 3). As described above, the angular velocity sensor shown in FIG. 1, in which the piezoelectric layer 4 has the base portion 4A extending outwardly at its lower side of the periphery, is provided.

In the method described above, the silicon substrate 1 is dry-etched in a vertical downward direction, since the portion of the substrate 1 beneath the base portion 4a formed at the lower portion of the piezoelectric layer 4 is not etched. Under the consideration that the upper layer 5, the lower layer 3, and the piezoelectric layer 4 are stacked over only one surface of the substrate 1, it may be necessary to decrease the mass of the other surface of the substrate 1 to bring the substrate 1 into balance.

Figure 15:
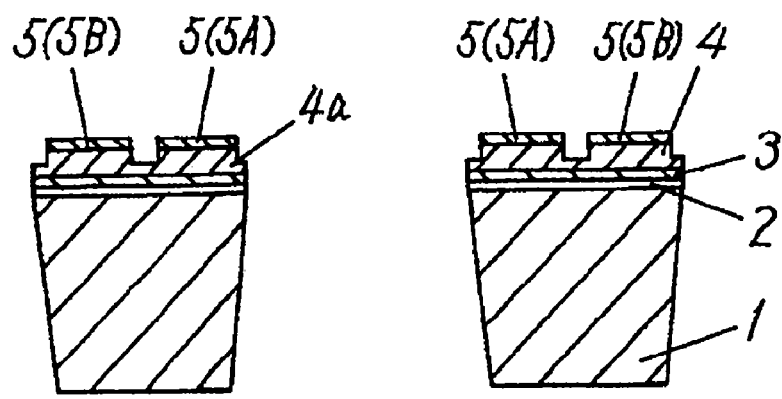
FIG. 15 is a sectional view of the angular velocity sensor for showing the process according to the embodiment.

In this case, the substrate 1 may be etched so as to slender toward its bottom, as shown in FIG. 15, with etching gas containing $SF_6$ and $O_2$ increased and $C_4F_8$ decreased. The gas allows the substrate 1 to have strongly-etched surface opposite to the surface having the buffer layer 2 thereon, thus tapering off the substrate 1 toward its bottom, as shown in FIG. 15.

As mentioned above, the single angular velocity sensor is described. The case in which plural sensors are simultaneously formed will be described.

Figure 16:
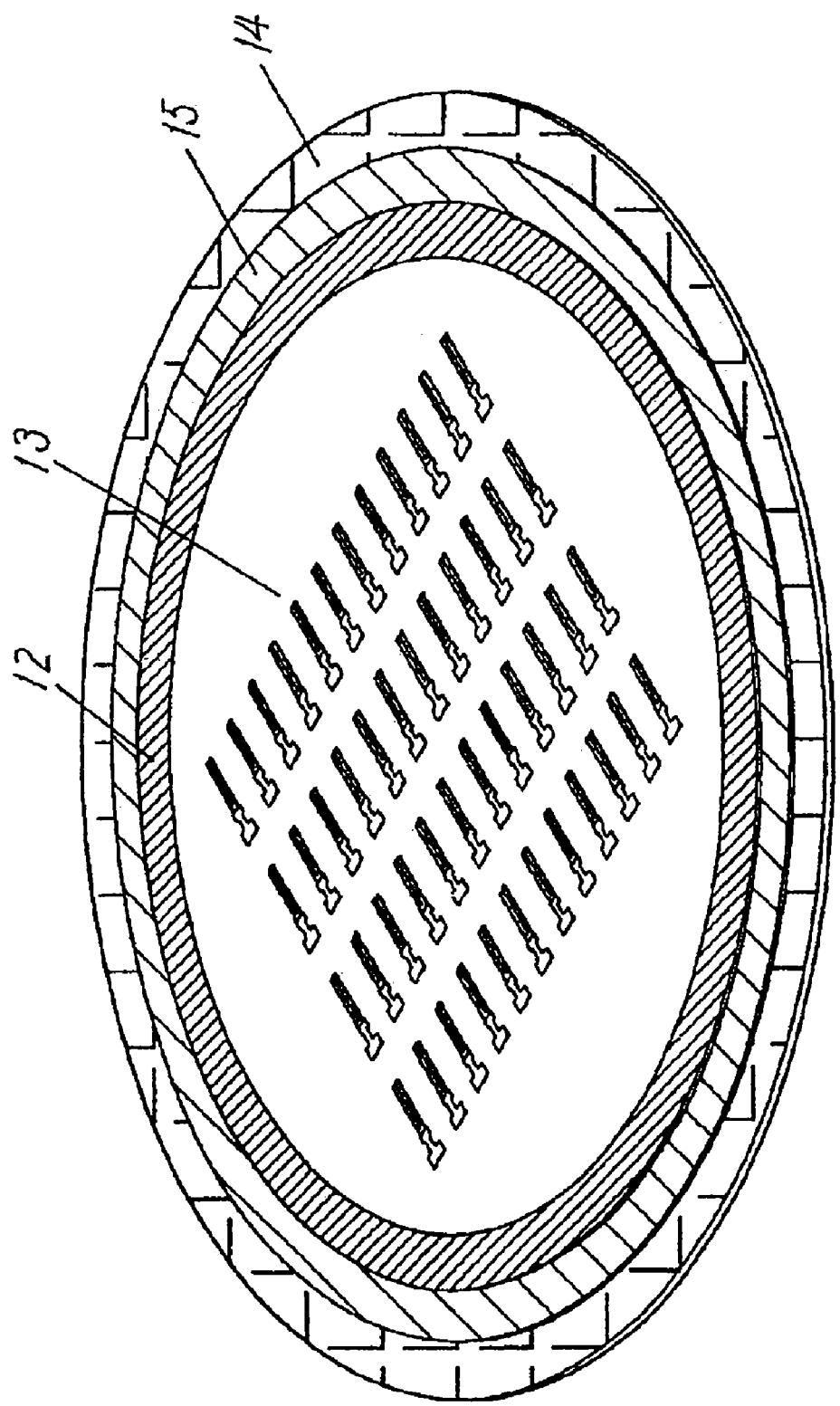
FIG. 16 is a perspective view of the angular velocity sensor for showing the process according to the embodiment.
Figure 17:
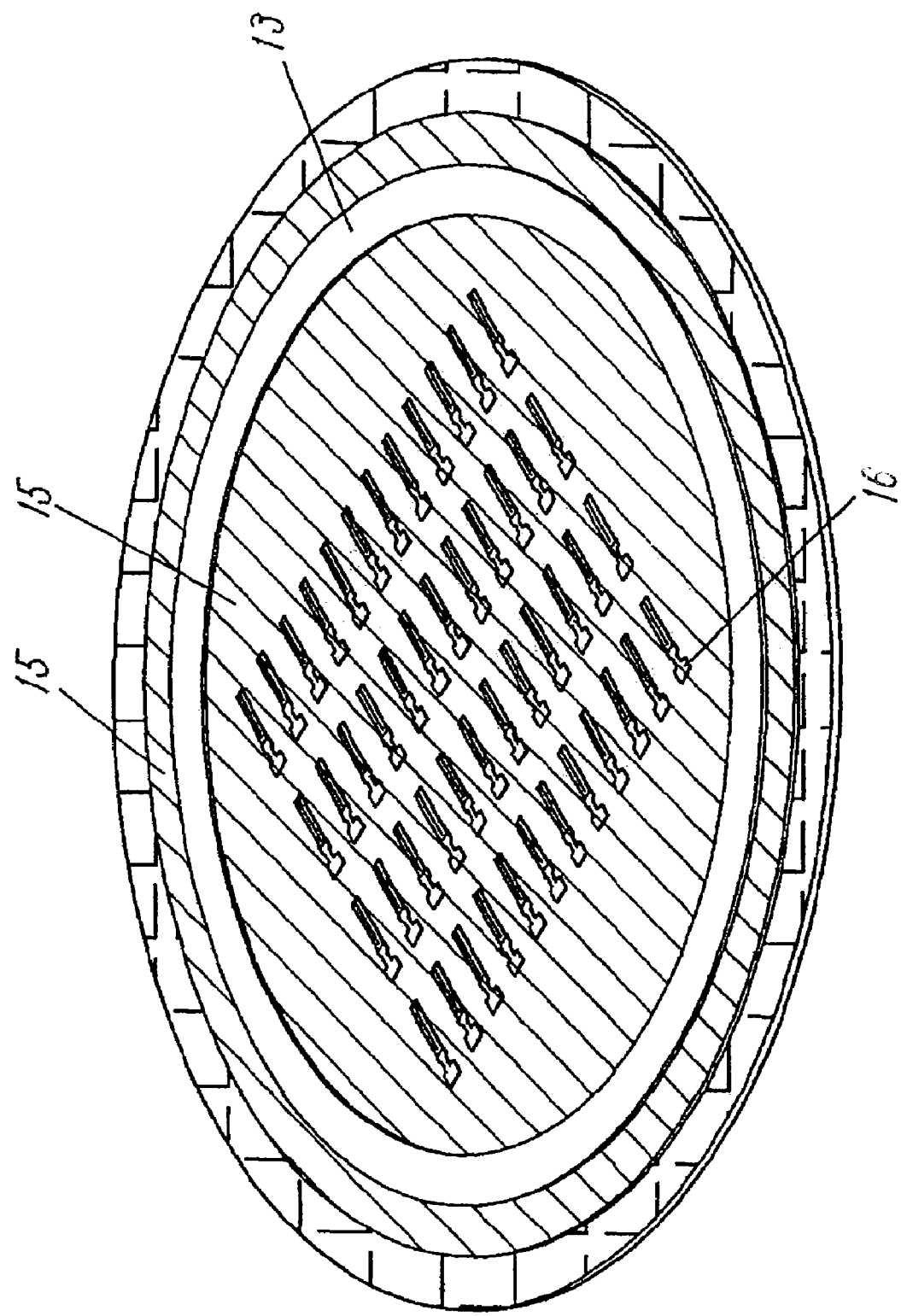
FIG. 17 is a perspective view of the angular velocity sensor for showing the process according to the embodiment.

FIG. 16 illustrates a dry-etching process of a silicon substrate 13. The substrate 13 to be etched is bonded to a glass-made dummy substrate 14 through a bonding member 15. The bonding member 15 is formed of material having a color different than the silicon substrate 13, for example, paste containing white alumina particles. Removing an unnecessary surface of the substrate 13 by dry-etching exposes the colored bonding member 15, which shows completion of etching at a glance. After the silicon substrate 13 is etched, angular velocity sensors 16 are separated into individual pieces. Before the separation, the dummy substrate 14 securely holds the individual pieces of the angular velocity sensors 16 through the bonding member 15 so as not to allow the sensors to come apart. Another advantage is that the dummy substrate 14 made of glass has an exposed surface unaffected by the etching gas while the substrate 13 is being etched or after the substrate 13 is etched, thereby providing etching with high consistency. In the process, a resist film 12 is disposed on the substrate 13.

According to the embodiment, the buffer layer 2 allows the piezoelectric layer 4 to be securely bonded to the silicon substrate 1 via the lower electrode layer 3. The lower electrode 3 may be formed of platinum (Pt) containing 1 to 15% of titanium (Ti), and thus, the mixed Ti is aligned in a manner identical to a lattice constant of the piezoelectric layer 4 on the Pt-layer. The lower electrode layer 3 can securely hold the buffer layer 2 without the buffer layer 2. An angular velocity sensor which does not have the buffer layer 2 is manufactured by the method above, in which the process of forming the buffer layer 2 is simply omitted from the procedure.

An angular velocity sensor is described as just an example of piezoelectric devices according to the embodiment, but it is not limited to the sensor. The present invention can be applicable to any piezoelectric devices including an piezoelectric body, such as a sensor, an actuator, a memory, and an optical switch, as long as the device has electrodes and a piezoelectric layer 4 sandwiched between the layers, and as long as the device utilizes a change in characteristics, e.g. a warp, and a change in permittivity, of the piezoelectric layer 4 caused by a of voltage applied to the electrodes.

INDUSTRIAL APPLICABILITY

A piezoelectric device of the present invention, as described above, includes a piezoelectric layer having an outwardly extending base portion formed at its lower of its periphery. This arrangement allows the piezoelectric layer, a lower electrode layer, and a buffer layer underlying have areas larger than the area of an upper electrode layer. The layers contact a substrate through the large area, thus having an enhanced strength in bonding. The base portion lengthens a creeping distance between the upper and lower electrode layers, thus protecting the electrode layers from short-circuiting between the electrode layers.

The invention claimed is:

1. A method of manufacturing a piezoelectric device, comprising the steps of:
   stacking a buffer layer on a substrate, a lower electrode layer on the buffer layer, a piezoelectric layer on the lower electrode layer, and an upper electrode layer on the piezoelectric layer;
   forming a first resist film on the upper electrode layer;
   etching a portion of the piezoelectric layer uncovered with the first resist film exclusive of a lower portion of the piezoelectric layer toward the lower electrode;
   stripping off the first resist film;
   forming a second resist film on the upper electrode layer covered with the first resist film and on a surface of the lower portion of the piezoelectric layer; and
   etching portions of the buffer layer, the lower electrode layer, and the piezoelectric layer to expose a surface of the substrate, the portions being uncovered with the second resist film.

2. The method of claim 1, wherein the buffer layer contains at least one of NiO, CoO, MgO, and Ti, the lower electrode layer contains Pt, the piezoelectric layer contains lead titanate zirconate, and the upper electrode layer contains Au.

3. The method of claim 1,
   wherein the substrate contains Si, and
   wherein said step of etching portions of the buffer layer, the lower electrode layer, and the piezoelectric layer uncovered with the second resist film comprises the sub-steps of:
      etching the buffer layer, the lower electrode layer, and the piezoelectric layer by first etching gas; and
      then, etching the buffer layer, the lower electrode layer, and the piezoelectric layer by second etching gas.

4. The method of claim 3, further comprising the step of:
   etching the substrate so as to increase an etched portion thereof toward a surface thereof opposite to a surface thereof on which the buffer layer is disposed.

5. The method of claim 3, wherein said step of etching the substrate-comprises the sub-step of etching the substrate having a dummy substrate bonded thereto, with a bonding member, on the surface thereof on which the buffer layer is disposed surface.

6. The method of claim 5, wherein the dummy substrate is made of glass, and the bonding member has a color different from a color of the substrate.

7. A method of manufacturing a piezoelectric device, comprising the steps of:
   stacking a lower electrode layer on a substrate, a piezoelectric layer on the lower electrode layer, and an upper electrode layer on the piezoelectric layer;
   forming a first resist film on the upper electrode layer;
   etching a portion of the piezoelectric layer uncovered with the first resist film exclusive of a lower portion of the piezoelectric layer toward the lower electrode;
   stripping off the first resist film;
   forming a second resist film on the upper electrode layer covered with the first resist film and a surface of the lower portion of the piezoelectric layer; and
   etching away portions of the piezoelectric layer and the lower electrode layer to expose a surface of the substrate, the portions being uncovered with the second resist film.

8. The method of claim 7, wherein the lower electrode layer contains Pt, the piezoelectric layer contains lead titanate zirconate, and the upper electrode layer contains Au.

9. The method of claim 7,
   wherein the substrate contains Si, and
   wherein said step of etching away the portions of the piezoelectric layer and the lower electrode layer comprises the sub-steps of:
      etching the piezoelectric layer and the lower electrode layer by first etching gas, and
      then, etching the piezoelectric layer and the lower electrode layer by second etching gas.

10. The method of claim 9, further includes the step of:
    etching the substrate so as to increase an etched portion thereof toward a surface thereof opposite to a surface thereof on which the lower electrode layer is disposed.

11. The method of claim 10, wherein said step of etching the substrate comprises the sub-step of etching the substrate having a dummy substrate bonded thereto, with a bonding member, on the surface thereof on which the lower electrode layer is disposed.

12. The method of claim 11, wherein the dummy substrate is made of glass, and the bonding member has a color different from a color of the substrate.

* * * * *

UNITED STATES PATENT AND TRADEMARK OFFICE
CERTIFICATE OF CORRECTION

| | | |
|---|---|---|
| PATENT NO. | : 7,380,320 B2 | Page 1 of 1 |
| APPLICATION NO. | : 11/566379 | |
| DATED | : June 3, 2008 | |
| INVENTOR(S) | : Masaya Nakatani | |

It is certified that error appears in the above-identified patent and that said Letters Patent is hereby corrected as shown below:

On the Cover Page, please insert item (30) entitled "Foreign Application Priority Data", and list the following references:

Aug. 27, 2001    Japan    2001255689
    Oct. 15, 2001    Japan    2001316431

On the Cover Page, item (56), References Cited, FOREIGN PATENT DOCUMENTS:

"GB  2029092 A 3/1980" should read -- UK 2029092 A 3/1980 --

Signed and Sealed this

Seventh Day of October, 2008

JON W. DUDAS
*Director of the United States Patent and Trademark Office*